United States Patent
Noetzel et al.

(10) Patent No.: US 10,644,303 B2
(45) Date of Patent: May 5, 2020

(54) METHOD FOR THE FABRICATION OF INDIUM-GALLIUM NITRIDE ELECTRODES FOR ELECTROCHEMICAL DEVICES

(71) Applicant: UNIVERSITA' DEGLI STUDI DI MILANO BICOCCA, Milan (IT)

(72) Inventors: Richard Noetzel, Eindhoven (NL); Stefano Sanguinetti, Abbiategrasso (IT)

(73) Assignee: UNIVERSITÁ DEGLI STUDI DI MILANO BICOCCA, Milan (IT)

( * ) Notice: Subject to any disclaimer, the term of this patent is extended or adjusted under 35 U.S.C. 154(b) by 0 days.

(21) Appl. No.: 16/085,731

(22) PCT Filed: Mar. 14, 2017

(86) PCT No.: PCT/EP2017/056029
§ 371 (c)(1),
(2) Date: Sep. 17, 2018

(87) PCT Pub. No.: WO2017/157960
PCT Pub. Date: Sep. 21, 2017

(65) Prior Publication Data
US 2019/0109319 A1    Apr. 11, 2019

(30) Foreign Application Priority Data

Mar. 15, 2016   (IT) .................. 102016000027125

(51) Int. Cl.
*H01L 21/00*    (2006.01)
*H01M 4/04*    (2006.01)
(Continued)

(52) U.S. Cl.
CPC .......... *H01M 4/0421* (2013.01); *C30B 25/02* (2013.01); *C30B 29/403* (2013.01); *C30B 33/06* (2013.01);
(Continued)

(58) Field of Classification Search
None
See application file for complete search history.

(56) References Cited

U.S. PATENT DOCUMENTS

2015/0236374 A1    8/2015    Asano et al.

FOREIGN PATENT DOCUMENTS

JP        2004319250 A      11/2004
JP        2009019233 A      1/2009

OTHER PUBLICATIONS

Kim et al., "Indium-related Novel Architecture of GaN Nanorod Grown by Molecular Beam Epitaxy," Chemical Physics Letters 412(4-6):454-458 (2005).
(Continued)

*Primary Examiner* — Reema Patel
(74) *Attorney, Agent, or Firm* — Pepper Hamilton LLP

(57) ABSTRACT

It is described a method for realizing catalytically active electrochemical electrodes with maximized surface area. In the method, InGaN is deposited epitaxially in form of a thin layer on a Silicon substrate exposing a (111) crystal fac, thus forcing the InGaN electrode material to grow exposing a catalytically active surface. The substrate is then removed, the InGaN layer is made into fragments and these are transferred onto a conductive support with one-, two- or three-dimensional structure which can be a wire, a two-dimensional conductive foil which, possibly folded, or a three-dimensional conductive fabric, sponge or cage-like structure. It is thus possible to obtain an InGaN-based electrode with increased surface area and exposing surfaces with high catalytic activity.

22 Claims, 1 Drawing Sheet

(51) Int. Cl.
    *C30B 25/02* (2006.01)
    *C30B 29/40* (2006.01)
    *H01L 21/02* (2006.01)
    *H01M 4/88* (2006.01)
    *C30B 33/06* (2006.01)
    *H01G 9/20* (2006.01)
    *C30B 23/02* (2006.01)

(52) U.S. Cl.
    CPC ......... *H01G 9/205* (2013.01); *H01L 21/0254* (2013.01); *H01L 21/02381* (2013.01); *H01L 21/02433* (2013.01); *H01M 4/8867* (2013.01); *H01M 4/8878* (2013.01); *C30B 23/02* (2013.01); *H01L 21/02664* (2013.01); *Y02E 10/542* (2013.01); *Y02E 60/13* (2013.01)

(56) References Cited

OTHER PUBLICATIONS

Rodriguez et al., "Electrocatalytic Oxidation Enhancement at the Surface of InGaN Films and Nanostructures Grown Directly on Si(111)," Electrochemistry Communications 60:158-162 (2015).
PCT International Search Report and Written Opinion for correspondence PCT/EP2017/056029, dated May 12, 2017.

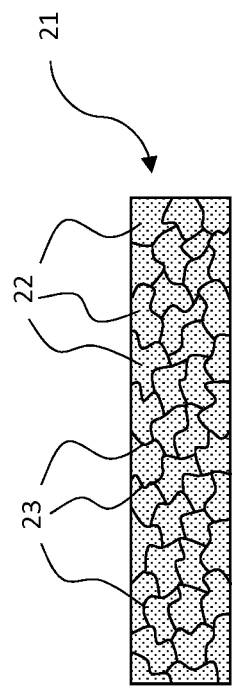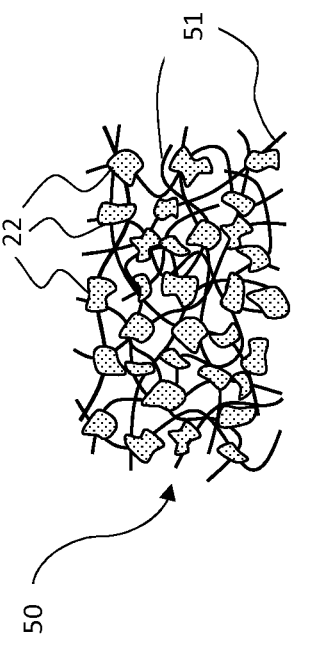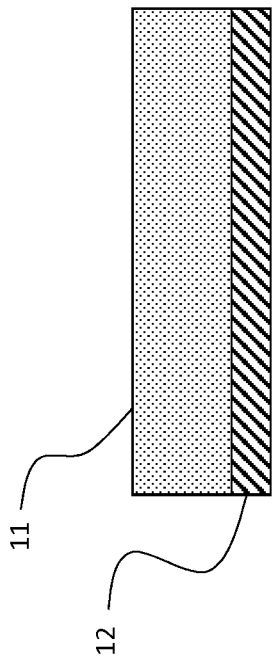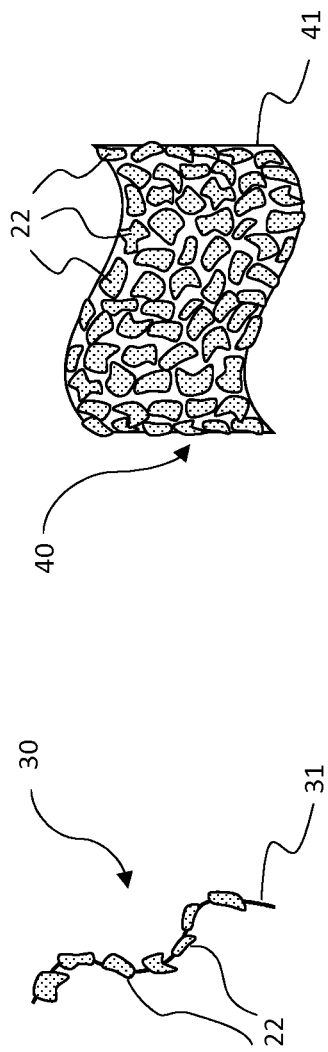

METHOD FOR THE FABRICATION OF INDIUM-GALLIUM NITRIDE ELECTRODES FOR ELECTROCHEMICAL DEVICES

This application is a national stage application under 35 U.S.C. § 371 of PCT Application No. PCT/EP2017/056029, filed Mar. 14, 2017, which claims priority of Italy Application No. 102016000027125, filed Mar. 15, 2016, which are hereby incorporated by reference in their entirety.

FIELD OF INVENTION

The invention relates to a method for the fabrication of high efficiency electrodes to be used in the field of electrochemical devices. A great variety of these devices is known, which are employed to drive chemical reactions.

BACKGROUND AND PRIOR ART

Electrochemical devices have wide application areas in the economical and societal most relevant fields such as energy, health and environment. Just to name a few, applications of these devices include solar cells and solar hydrogen generation by water splitting for solar energy harvesting and storage; biosensors for medical diagnostics, environmental monitoring and food control; and batteries, supercapacitors and fuel cells for energy storage and supply.

All these electrochemical devices and their applications rely on efficient electrochemical electrodes characterized by high catalytic activity of the electrode material surface together with large surface area. Many widely used electrode materials, such as metal oxides and group IV and group III-V semiconductors, have a crystal structure with crystallographic planes of different catalytic activity due to different surface energy and chemical bond configurations. For high electrode efficiency, the exposure of crystallographic planes with high catalytic activity for a certain electrode material together with large surface area of these planes are required.

Patent application JP 2009-019233 A discloses a method of fabrication of electrodes that broadly comprises the steps of high-rate depositing a material onto a surface of a substrate, detaching the obtained deposit in the form of powders from the substrate; and transferring the powder onto a conductive support, e.g., a copper foil; to produce electrodes for batteries.

A possible way to maximize surface area is to develop nanostructured electrode materials either by utilizing self-assembled isolated/colloidal nano- and microstructures or by utilizing self-assembled electrode surface nano- and microstructures such as nano/microwalls, nano/microflakes or nano/microwires, rods, columns. This approach, however, inherently leads to exposure of surfaces with low or no catalytic activity due to minimization of the surface energy in the formation process.

Among the cited semiconductors, so far Indium Gallium Nitride (InGaN) has allowed the production of electrodes with the highest efficiencies per surface area, in particular when prepared in form of layered material and related heterostructures exposing the catalytically active crystallographic c-plane. Independently, catalytic activities can be improved by doping or (co/electro-)catalyst coupling where there is no increase of surface area. The best results have been obtained with epitaxial InGaN material with surface InN quantum dots (QDs) on a sapphire and silicon substrates. QDs are islands of the material with size of a few nm in all three spatial directions, capable to confine the charge carriers (electrons and holes) in an extremely limited space; this arrangement gives rise to novel or enhanced optoelectronic properties. InN/InGaN QDs and their applications in the fields of electrochemical reactions in general have been described in several papers, such as "An InN/InGaN Quantum Dot Electrochemical Biosensor for Clinical Diagnosis", Naveed ul Hassan Alvi et al., Sensors, 2013, 13, 13917-13927; and "Electrocatalytic oxidation enhancement at the surface of InGaN films and nanostructures grown directly on Si(111)", Paul E. D. Soto Rodriguez et al., Electrochemistry Communications, 60 (2015) 158-162.

The paper "Indium-related novel architecture on GaN nanorod grown by molecular beam epitaxy", Y. H. Kim et al., Chemical Physics Letters, 412 (2005) 454-458, describes the production of GaN free-standing nanostructures; no particular morphology of these nanostructures, in relation to the crystalline lattice axes, is mentioned.

Structures produced by epitaxially growing films on silicon (111) substrates are known in the art, e.g., from patent application JP 2004-319250 A; this document describes the production of InGaAs, p-doped layers.

A general problem encountered with these materials is the potential limitation, for geometric/structural reasons of the substrate. Mainly the substrates inhibit the increase of surface area of the electrode active material on which the QDs are produced. Besides, the performance of these materials, albeit satisfactory, is still susceptible of improvement. The problem is, therefore, how to realize an electrode with increased surface area, exposing surfaces with high catalytic activity of the electrode active material.

It is therefore an object of the present invention to provide an electrode having, as the active element, fragments of InGaN and related heterostructures with increased surface area and exposing surfaces with high catalytic activity.

SUMMARY OF THE INVENTION

This and other objects are achieved with the present invention, which in a first aspect thereof is about a method to for the fabrication of electrodes comprising the steps of:
 a) epitaxially depositing indium-gallium nitride (InGaN) in form of a thin layer onto a surface of a silicon substrate exposing a (111) crystal face, such that said surface causes the InGaN to grow exposing a surface with high catalytic activity;
 b) detaching the deposit of InGaN from the substrate;
 c) fragmenting the deposit of InGaN;
 d) transferring the fragments of InGaN thus obtained onto a conductive support with one-, two- or three-dimensional structure.

Optionally, the method of the invention comprises a further step a') carried out between steps a) and b), consisting in the production, over the surface of the InGaN layer, of three-dimensional InN discrete nanostructures, such as quantum dots or quantum rings.

In a second aspect thereof, the invention relates to the electrodes produced by the process described above.

BRIEF DESCRIPTION OF THE DRAWINGS

The invention will be described in detail in the following, with reference to the accompanying drawings in which:
 FIG. 1 shows a layer of InGaN deposited on a silicon substrate;
 FIG. 2 shows the InGaN after substrate removal, ready for fragmentation along the black lines;

FIG. 3 shows a first embodiment of electrode of the invention, in which the fragments of InGaN are connected to a wire of conductive material;

FIG. 4 shows a first embodiment of electrode of the invention, in which the fragments of InGaN are connected to a foil of conductive material; and FIG. 5 shows a second embodiment of electrode of the invention, in which the fragments of InGaN are connected to a conductive material formed as a structure presenting openings.

In the drawings, the size of the different parts is not in scale, and in particular the thickness of the film of InGaN and the size of fragments of the same are greatly exaggerated for clarity of representation.

DETAILED DESCRIPTION OF THE INVENTION

The inventors have found a simple and convenient way to obtain a structure in which fragments of InGaN and related heterostructures are first produced in a form that exposes a catalytically active surface; then, these fragments are collected and connected in a three-dimensional arrangement to an electrode support. With this method, an arrangement is obtained in which each of said fragments maintains exposed the highly catalytic surface, while increasing the exposed surface area compared to that of the original epitaxial layer, thus realizing an electrode with increased efficiency.

Optionally, and according to a preferred embodiment of the invention, the InGaN fragments carry, on the exposed catalytically active surface, discrete InN nanostructures, such as quantum dots or quantum rings. In the description and the claims, InGaN layers or fragments having discrete InN nanostructures on one surface are referred to as "InGaN related heterostructures"; besides, in the rest of the description, whenever layers and fragments of InGaN are mentioned, it is always intended that these may carry InN nanostructures to form said heterostructures, unless the contrary is explicitly mentioned.

The steps of the process have been indicated as a) to d) to clearly identify them, but this does not imply that these steps must necessarily be performed in the indicated order. As will be apparent from the description that follows, in particular the order of steps b) and c) can be interchanged, or these can be carried out essentially simultaneously, as part of a single operation. Similarly, the order of steps c) and d) can be interchanged, particularly when the electrode conductive support is a two-dimensional structure.

In step a) of the method of the invention, InGaN is epitaxially deposited in the form of a thin layer over a silicon substrate exposing a (111) crystal face. The term "thin layer", analogous to "thin film", is well understood by the skilled person; for the purposes of the present invention, a thin layer is a layer having preferably a thickness ranging between about 5 nm and 5 µm, more preferably between 10 nm and 2 µm. Deposition techniques suitable for epitaxy are well-known in the field of material science and include, among others, metalorganic vapor-phase epitaxy, a modification of chemical vapor deposition, or molecular beam epitaxy (MBE). When an epitaxial film is deposited onto a substrate of different chemical composition, as in the present invention, the process is called heteroepitaxy.

With reference to FIG. 1, epitaxy is a technique in which the substrate, 12, plays the role of a seed crystal, so that the film on it, 11, grows along the desired crystallographic orientation. In this technique, by knowing the surface of the deposited material that it is desired to expose, it is possible to select a substrate and growth conditions that assure the growing of target material exposing the correct crystal face.

In the present invention, InGaN and related heterostructures are grown on silicon (111) as the substrate; silicon substrates cut along the (111) face are widely employed in the field, and are commercially available. Over silicon (111), InGaN layer epitaxially grows along the c-axis and consequently exposes the c-plane, having high catalytic activity.

Epitaxy also permits the fabrication of heterostructures with optimum design to maximize surface activity. In the preferred embodiment of the invention, InN quantum dots or quantum rings are grown over an InGaN layer. In this system, the inventors have observed enhanced catalytic activity due to a high density of positively charged surface donor states and quantum repulsion of electrons out of the dots leaving uncompensated donors.

In step b) of the method of the invention, the epitaxial film 11 is detached from the substrate 12. This can take place by any suitable technique: for instance, it is possible to remove the substrate mechanically, for instance by mechanical grinding or selective dry etching; alternatively, it is possible to chemically etch (wet etching) the substrate in a selective manner, exploiting a different solubility of the two materials in a suitable solvent. It is also possible to combine mechanical grinding and etching where most of the substrate is first removed by mechanical grinding, and the final part is removed by etching. In the description that follows and in the appended claims, by "detaching" it is meant any operation achieving the result of physically separating the epitaxial layer of InGaN (and related heterostructures) from the silicon substrate, allowing the recovery of the former.

The result of this step of the method of the invention may be a stand-alone film, as shown for instance as element 21 in FIG. 2. It is then needed a step c) as a separate method step, in which the film thus obtained is broken into fragments, 22, for instance along the lines 23 exemplified in the figure. Possible methods for breaking film 21 into fragments are mechanical shock or vibration, possibly with the aid of ultrasonic stirring. This provides an additional design parameter, as the resulting average size of the InGaN fragments will depend on the strength of the mechanical shock or vibration in ultrasonic stirring. Once film 21 is broken up, the fragments of InGaN are collected and may be separated in fractions of different size ranges, for example by centrifugation and separation, so as to narrow the size distribution and obtain a more homogeneous and controlled behavior of the final electrode.

It is also possible that the detachment step itself causes the breaking up of the film into fragments, due to the scarce mechanical resistance of very thin films, or if the film is disconnected, or has cracks or it is porous. In this case in practice steps b) and c) of the method take place simultaneously, or the latter shortly after and as a direct consequence of the former.

The last step of the method of the invention, d), consists in the transfer of the fragments 22 of film 21 onto a conductive support, and in causing the adhesion of these fragments to said support.

The support may have any shape. It may be essentially one-dimensional, two-dimensional, or three-dimensional. One-dimensional supports are wires, which can be straight or curved. Two-dimensional supports are typically foils (plane or curved) of conductive materials. Finally, the support may have a three-dimensional shape, and in particular it may have a structure presenting openings, such as a net, a fabric, a sponge-like or cage-like structure; these latter structures have the advantage of a higher exposed surface for unit of volume of the electrode as a whole.

These alternative embodiments are schematically represented in FIGS. 3, 4 and 5; in FIG. 3, the conductive support is in the form of a wire, 31; in FIG. 4 the conductive support is in the form of a folded foil, 41; in FIG. 5, it is exemplified a conductive support in the form of a three-dimensional net, 51; in all cases shown in FIGS. 3, 4 and 5, fragments 22 of film 21 are adhered onto the conductive support.

More in detail, FIG. 3 shows a one-dimensional electrode (30) produced according to a first alternative possible embodiment of the invention, in which the support is a wire 31, shown in a generic bent arrangement, but which could also be straight or wound, onto which fragments 22 of InGaN are adhered.

FIG. 4 shows a two-dimensional electrode (40) produced according to a second alternative possible embodiment, in which the support is a foil (41) of conductive material, which can be bent, folded or rolled up, to generate a three-dimensional arrangement of electrode active material fragments 22 with increased surface area per geometric area.

Finally, FIG. 5 shows another embodiment of the invention, in which the fragments (22) of electrode active material are joined to a three-dimensional conductive support 51, obtaining an electrode (50) with a three-dimensional structure. Possible embodiments of the three-dimensional conductive structure comprise a conductive fabric or sponge or cage-like structure. This second case allows obtaining electrodes with the highest activity, because the fragments 22 are not confined to the surface of a two-dimensional foil (irrespective of how much this foil can be folded into a convoluted shape), but rather, said fragments are distributed both on the outer geometric surface of the electrode as well as on the inner surfaces of the same, with an increased surface area per geometric volume/area.

The support may be produced with any conductive material, in particular those established for supporting colloidal semiconducting or metal-oxide particles. Examples of materials that can be used for producing two-dimensional supports are aluminum foils, the use of which is known for the production of supercapacitors, and conductive polymer films and fibers, which have been used for sensors applications. In case of three-dimensional supports, examples of useful materials are conductive carbon nanotube wrapped textile fibers, pure carbon nanotube networks or graphene flake assemblies, which have been used in fuel cells and supercapacitors.

The transfer of the fragments of InGaN onto the conductive support and the consolidation of the structure can be carried out adopting the established technology for colloidal structures. Exemplary methods to facilitate the transfer of the fragments onto the conductive support are reported, e.g., in patent application US 2006/0278534 A1, and include dipping the substrate in a liquid medium containing the fragments and stirring or bubbling the liquid suspension. Preferably the fragments and the conductive support are also charged, so that the attachment of the nanoparticles on the surface of the conductive support takes place via electrostatic bonding. To stabilize the resulting structure, it is possible to employ a polymer electrolyte membrane (as well known in the field of fuel cells), for instance a Nafion® based membrane (Nafion is a registered trademarks of E. I. du Pont de Nemours and Company).

A typical process according to the invention thus comprises the following steps:
providing a Si (111) substrate;
growing a InGaN epitaxial layer on the silicon substrate with nanostructured top surface;
removing the silicon substrate by chemical etching in KOH;
breaking the InGaN layer in small fragments, e.g. by ultrasonic stirring;
transferring the fragments to a conductive electrode support (e.g., an aluminum foil);
covering the resulting structure with a Nafion® membrane by dipping.

Compared to known cases in which electrode active material is present in the form of thin layer on a substrate, the electrodes of the invention offer the advantage that the fragments 22 present a greater exposed surface: for each fragment 22, the catalytically active surface area is almost doubled (back and front side), thus leading to a large exposed area of the surface with high catalytic activity of electrode active material, and eventually to increased electrochemical activity.

Another possibility is that the epitaxial film 21 is initially transferred on a 2D conductive support. In this case, by bending the 2D conductive support the InGaN layer will fracture. In this embodiment, thus, step d) is carried out before step c).

The invention claimed is:

1. A method for the fabrication of electrodes, comprising the steps of:
    a) epitaxially depositing Indium-Gallium Nitride (InGaN) in form of a thin layer onto a surface of a silicon substrate exposing a crystal face;
    b) detaching the deposit of InGaN from the substrate;
    c) fragmenting the deposit of InGaN;
    d) transferring the fragments of InGaN thus obtained onto a conductive support with one-, two- or three-dimensional structure.

2. The method according to claim 1, comprising a further step
    a') carried out after step a), in which quantum dots or quantum rings of InN are produced onto said InGaN layer.

3. The method according to claim 1, in which steps b) and c) take place simultaneously, or step c) immediately after and as a direct consequence of step b).

4. The method according to claim 1, in which step a) is carried out by metalorganic vapor-phase epitaxy or molecular beam epitaxy (MBE).

5. The method according to claim 1, in which step b) is carried out by a technique selected among mechanical grinding, selective dry etching, wet etching or combinations thereof.

6. The method according to claim 1, in which step c) is carried out by shock, vibration, ultrasonic stirring or combinations thereof.

7. The method according to claim 1 in which, after step c), the obtained fragments are separated into fractions of different size ranges, recovering one or more fractions of narrow size distribution to be used in step d).

8. The method according to claim 1, in which step d) is carried out by preparing a suspension of the fragments obtained in step c) in a liquid medium, immersing the conductive support with one, two- or three-dimensional structure in said suspension, and bubbling or stirring said suspension.

9. The method according to claim 1, in which step d) further comprises carrying out an operation of adhering said fragments to said conductive support via electrostatic bonding.

10. The method according to claim 1, in which step d) further comprises carrying out an operation of stabilizing the resulting structure using a polymer electrolyte membrane.

11. An electrode produced according to claim 1.

12. The electrode according to claim 11, in which the conductive support has a one-dimensional structure and is in the form of a straight, bent or wound wire onto which fragments of InGaN are adhered.

13. The electrode according to claim 11, in which the conductive support has a two-dimensional structure and is in the form of a plane or curved foil onto which fragments of InGaN are adhered.

14. The electrode according to claim 13, in which the conductive support is an aluminum foil.

15. The electrode according to claim 11, in which the conductive support has a three-dimensional structure and is in the form of a net, a fabric, a sponge-like or a cage-like structure onto the surfaces of which fragments of InGaN are adhered.

16. The electrode according to claim 15, in which the conductive support is a carbon nanotube wrapped textile fiber, a pure carbon nanotube network or a graphene flake assembly.

17. An electrode produced according to claim 2.

18. The electrode according to claim 17, in which the conductive support has a one-dimensional structure and is in the form of a straight, bent or wound wire onto which fragments of InGaN are adhered.

19. The electrode according to claim 17, in which the conductive support has a two-dimensional structure and is in the form of a plane or curved foil onto which fragments of InGaN are adhered.

20. The electrode according to claim 19, in which the conductive support is an aluminum foil.

21. The electrode according to claim 17, in which the conductive support has a three-dimensional structure and is in the form of a net, a fabric, a sponge-like or a cage-like structure onto the surfaces of which fragments of InGaN are adhered.

22. The electrode according to claim 21, in which the conductive support is a carbon nanotube wrapped textile fiber, a pure carbon nanotube network or a graphene flake assembly.

* * * * *